US006893502B2

(12) United States Patent
Papadimitrakopoulos et al.

(10) Patent No.: US 6,893,502 B2
(45) Date of Patent: May 17, 2005

(54) APPARATUS AND METHOD FOR FABRICATION OF PHOTONIC CRYSTALS

(75) Inventors: Fotios Papadimitrakopoulos, Coventry, CT (US); Harris L. Marcus, Storrs, CT (US)

(73) Assignee: University of Connecticut, Farmington, CT (US)

( * ) Notice: Subject to any disclaimer, the term of this patent is extended or adjusted under 35 U.S.C. 154(b) by 0 days.

(21) Appl. No.: 10/220,519

(22) PCT Filed: Mar. 5, 2001

(86) PCT No.: PCT/US01/06976

§ 371 (c)(1), (2), (4) Date: Nov. 4, 2002

(87) PCT Pub. No.: WO01/66833

PCT Pub. Date: Sep. 13, 2001

(65) Prior Publication Data

US 2004/0118339 A1 Jun. 24, 2004

(51) Int. Cl.⁷ ............................................. C30B 25/12
(52) U.S. Cl. ........................... 117/92; 117/84; 117/103
(58) Field of Search .............................. 117/84, 92, 103

(56) References Cited

U.S. PATENT DOCUMENTS

| | | | |
|---|---|---|---|
| 5,600,483 A | 2/1997 | Fan et al. | |
| 6,058,127 A | 5/2000 | Joannopoulos et al. | |
| 6,075,640 A | 6/2000 | Nelson | |
| 6,093,246 A | 7/2000 | Lin et al. | |
| 6,101,300 A | 8/2000 | Fan et al. | |
| 6,130,969 A | 10/2000 | Villeneuve et al. | |

*Primary Examiner*—Felisa Hiteshew
(74) *Attorney, Agent, or Firm*—McCarter & English LLP (57) ABSTRACT

A process for the fabrication of a photonic crystal (and the crystal produced thereby) comprising producing a first beam of coherent light; generating a second and a third beam of coherent light each in a fixed phase relationship with the first beam; aligning the beams of coherent light so as to form a fixed relative angle of incidence between each pair of beams and to form an evanescent light interference pattern grid on a substrate having a first electrostatic charge; introducing into the evanescent light interference pattern grid a substance having a second electrostatic charge of an attractive nature to the first electrostatic charge; positioning the substance with the second electrostatic charge using the evanescent interference pattern grid in a planned manner on the substrate so as to form a photonic crystal. An apparatus for fabricating a photonic crystal is provided comprising a sample cell having a first electrostatic surface charge; a coherent light source operatively configured to generate a first beam of coherent light; at least one beam splitter optically coupled to the coherent light source for generating at least a second and a third beam of coherent light from the first beam of coherent light; at least one reflector in alignment with the beam splitter so as to receive the first, second and third beams of coherent light, said reflector operatively configured to align said first, second and third beams so as to form a relative angle of incidence between each pair of beams of approximately 120 degrees and to form an evanescent light interference pattern grid on said sample cell; which pattern gild can be used to position particles of a second electrostatic surface charge on the sample cell.

16 Claims, 12 Drawing Sheets

APPARATUS AND METHOD FOR FABRICATION OF PHOTONIC CRYSTALS

FIELD OF THE INVENTION

The present invention relates to photonic crystal fabrication, and more particularly, to laser-assisted solid freeform fabrication of photonic crystals, in particular of the micro and/or meso type.

BACKGROUND INFORMATION

In recent years, there has been a growing interest in developing micro/meso photonic structures with well-controlled periodic structures and well-defined defects. In particular there has been growing interest in the fabrication of photonic crystals. Photonic crystals (also known as photonic band-gap materials) are periodic dielectric structures that have a band gap that forbids propagation of a certain frequency of light. In photonic crystals three-dimensional (3D) periodic modulation in refractive index is used to cause an incident electromagnetic (EM) radiation with wavelength proportional to the periodicity of the photonic crystal to undergo Bragg diffraction in a given direction, resulting in the formation of a stop band in the transmission spectrum (see FIG. 5D). The introduction of metal or semiconductor in such periodic structures has been shown to broaden the stop band, leading to photonic band gap structures with novel application in numerous technologically important areas.

Photonic crystals permit the controlled manipulation of photons, thereby the control of electromagnetic radiation. The bandgap of the crystal can be varied by methods well known to those of ordinary skill in the art, as for example, altering the lattice spacing of the photonic material making up the crystals to match the wavelength which is wished to be blocked. That is, if the crystal is assembled in a precise lattice-like manner, the crystal can have a photonic bandgap, a range of forbidden frequencies within which a specific wavelength is blocked, and light is reflected.

Photonic crystals are typically fabricated from dielectric material, that is material that is an electrical insulator or in which an electric field can be perpetuated with a minimum loss of power. Periodic structures having a strong modulation in refractive index, and a diamond-type lattice, were among the first to be used as photonic crystals.

Many uses have been proposed in the art for photonic crystals, in particular in the fields of optoelectronics and photonics. Such uses include, but are not limited to, providing for zero threshold lasers based on the crystals ability to inhibit spontaneous emissions, use of the crystals as single-mode light emitting diodes, high Q frequency selective filters, angular filters and polarizers, use of the crystals in planar antenna substrates (thereby increasing the power radiated into the air) and solar cells, and employment of the crystals in wave guides in the optical domain, in particular as low-loss cladding material in waveguide structures that contain bends or junctions. Other applications for such crystal include their use in highly efficient reflectors (e.g. in the microwave and millimeter wave range where such structures present the ultimate substrate for antenna mounting).

As photonic crystals may be used to localize light within diffracting walls such that light can be bent without loss over tight 90° bends, to amplify light with minimum expense of energy (zero threshold lasing) and can be used to manipulate the path of light, the prospect of all-optical computing may in the near future become a reality. In addition, such structures may find important immediate applications in specialized mirror technologies, fiberoptic communication, advanced directional sensors and novel actuators. Photonic crystals may also be used to lower population inversion thresholds and increase solid state device efficiencies. Metallic replicas of photonic crystal structures may be used to provide thermoelectric and heat management devices with the unique ability to operate at precisely-controlled spectral width operations. Soft replicas of photonic crystals have also started to emerge, where the prospects of incorporating them within biological systems has created considerable interest in bio-photonic devices such as sensors, actuators, specialized photon reactors, and the like.

The absence of propagating EM modes inside a photonic band gap (PBG) affords some interesting effects in quantum optics, which may also find practical applications. For example, spontaneous emission of light can be controlled when an excited atom or molecule is embedded within a photonic crystal. The guest molecule can not make a transition to a lower energy state because the emission frequency is within the PBG of the host crystal, increasing the lifetime of its excited state.

As would be understood by one of ordinary skill in the art, if the stop bands for all directions of propagation overlap in some frequency range, a complete PBG can be created in which the density of photonic states (DOS) is zero. Structures exhibiting full PBGs in the microwave, millimeter, and submillimeter regimes have already been fabricated. However, until the present invention, the technological challenge of fabricating a 3-D photonic crystal having ordered structure with respect to the repeat of its subunits (that is, "opal-like") with controlled and well-defined defects in the visible and near-IR, where many future applications lie, has not been surmounted (1).

The current efforts to realize PBG structures at submicron length scales (necessary for visible and near IR applications) fall in two categories:

i) E-beam lithography/reactive ion etching followed by additional semiconductor growth or wafer fusion.

ii) Self-ordering of submicron colloidal spheres made either from polymers or silica, to form opal-like crystals (also called "synthetic opals").

E-beam lithography/reactive ion etching suffers from fabrication complexity. Further structures formed by E-beam lithograph/reactive ion etching typically exhibit finite thickness of the high refractive index semiconductor material that results in significant absorption in the visible and near IR region.

Self-ordering of submicron colloidal spheres made either from polymers or silica, to form opal-like crystals offers the advantage of permitting infiltration of the void spaces in the opals with high refractive index material. Synthetic opals made by such technique have been shown to display PBG structures if properly infiltrated with high refractive index materials forming hollow shell structures of the interconnected voids (1, 2). In general, synthetic opals are composed of equal diameter amorphous $SiO_2$ spheres, closely packed in 3D face-centered cubic (fcc) lattices. Stop bands have been observed mostly in the (111) plane direction (See 32 of FIG. 5A), which possesses the maximum scattering efficiency.

Figure 8A:
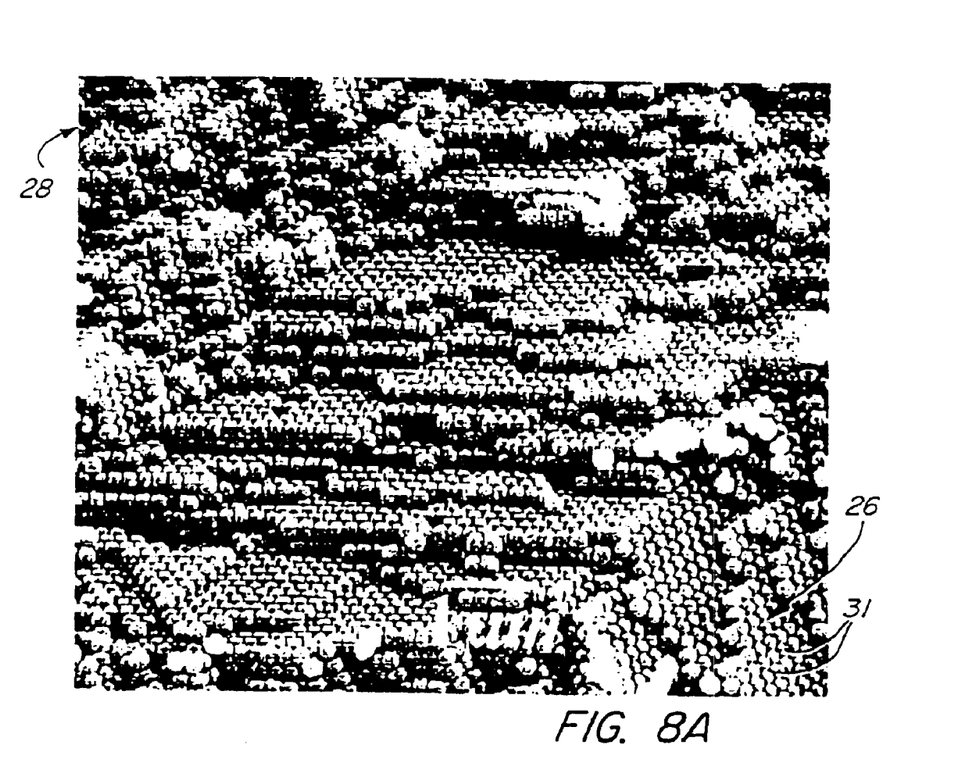
FIGS. 8A and 8B are scanning electron micrographs of a fractured surface of a prior art photonic crystal having undesirable microcrystallization domains, forming crystal grains non-registered with respect to each other.
Figure 8B:
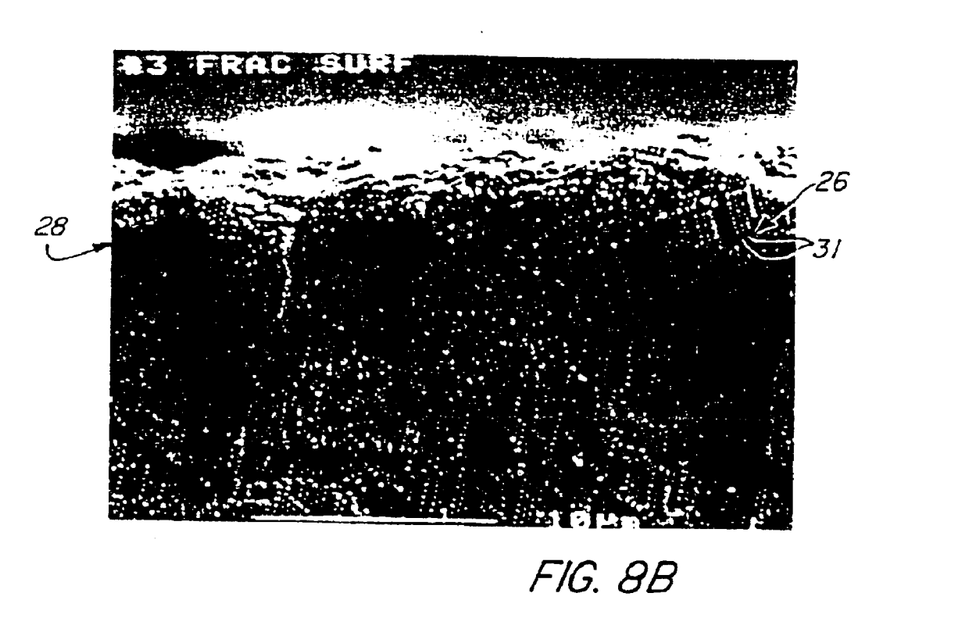

Beyond the problem of generating a complete photonic band gap in a synthetic opal formed by self-ordering of submicron colloidal spheres made either from polymers or silica, one of the biggest limitations associated with this approach is the fact that it is extremely difficult to fabricate a very large size single crystal. The process of making a photonic crystal by the self-ordering of submicron monodispersed (less than 5% standard deviation) spheres currently requires slow sedimentation which is typically accompanied by slow solvent evaporation. This sedimentation and evaporation leads to multiple nucleation and growth of polycrystalline photonic materials. In practice, nucleation sites having different crystal orientations (such as illustrated in FIGS. 8A and 8B) have limited technological applications.

Although the recent interest in photonic 3D periodic crystals that exhibit periodic modulation in refractive index has caused significant excitement in the scientific community, commercial realization of such well-controlled periodic structures, in particular where well-defined defects are inserted within, has been elusive. That is, the creation of long-range 3D single crystals with controlled-defects, in a manner that can be mass-produced, is not presently available for most materials. The methods set forth above for manufacturing phototonic crystals are simply too laborious and are limited to a restricted number of materials which can be employed in the construction process.

In light of the efforts of numerous groups around the world working with photonic crystals, there is an unanswered need for fabrication of long range photonic crystals structured as large photonic single crystals with well-defined defects. No economically viable alternative approaches have been reported.

SUMMARY OF THE INVENTION

It is an object of the present invention to provide an improved fabrication process for creating photonic crystals. Such process may be used to fabricate in a controlled manner comparatively large-sized photonic crystals with a complexity equivalent to those manufactured with microlithographic techniques, at significantly reduced cost. Such crystals may be used in any of the applications known for phototonic crystals (including those set forth above), as for example, fitting such crystals to curved surfaces.

The present invention provides a process where the self-ordering of the submicron "monodispersed" (narrow dispersion of sizes) spheres are assembled by the assistance of an optically defined lattice to maintain a single crystal orientation over unlimited distances. In addition to the ability to construct multi-component phases that are coherent in the crystal, the invention also provides an apparatus and methodology for incorporating precisely located defects within these structures. The construction of micro and/or meso photonic crystals and their devices has application to numerous optoelectronic and photonic applications as well as the potential for use in other novel physical systems.

It is well known that a beam of focused light has the ability to move optically transparent particles, in a technique commonly known as "optical tweezing." The present invention makes use of such technique to fabricate large continuous photonic crystals from micro and/or meso, uniform sized particles.

In a preferred embodiment of the present invention, three coherent beams interfere at 120° with respect to each other to establish a hexagonal evanescent interference pattern, where the spatial light intensity acts as a lattice of optical tweezers to create the first coherent deposited layer of uniform-sized $SiO_2$ spheres. Using electrostatic self-assembly, the first layer of spheres is immobilized to establish a well-controlled free-form 2-D periodic layer, whereas non-bonded particles that reside on top of this layer are easily removed in subsequent processes. The optical tweezer effect can be further augmented by the optical generation of local charge at the immobilizing surface interference pattern. This occurs by various exciton dissociation effects combined together with localized charge diffusion and charge trapping. (3). With the help of additional beams, an interference pattern is created to include controlled defects within the 2-D periodic structure, utilizing holographic imaging. In one embodiment, subsequent to creation of the defects, the defects are filled with a sacrificial material, such as monodispersed polymer spheres of size equal to the $SiO_2$ spheres, to enable the further construction of subsequent layers and the creation of controlled defects. Subsequent thermal treatments remove substantially all of the sacrificial spheres and organic materials, and carefully sinter the $SiO_2$ spheres in a robust structure suitable for further manipulation.

In another embodiment of the present invention, there is provided a system for fabricating photonic crystals, comprising: a sample cell having a first electrostatic surface charge; a coherent light source operatively configured to generate a first beam of coherent light; at least one beam splitter optically coupled to the coherent light source for generating at least a second and a third beam of coherent light form the first beam of coherent light; at least one reflector in alignment with the beam splitter so as to receive the first, second and third beam of coherent light, the reflector operatively configured to align the first, second and third beams so as to form a relative angle of incidence between each pair of beams of approximately 120 degrees and to form an evanescent light interference pattern grid on the sample cell; wherein the evanescent interference pattern grid can be used to position particles of a second electrostatic surface charge on said sample cell.

In another embodiment of the present invention, there is provided a method for fabricating a photonic crystal, comprising the steps of: producing a first beam of coherent light; generating a second and third beam of coherent light each in a fixed phase relationship with the first beam of coherent light; aligning the beams of coherent light so as form a fixed relative angle of incidence between each pair of beams and to form an evanescent light interference pattern grid on a substrate having a first electrostatic charge; introducing into the evanescent light interference pattern grid a substance having a second electrostatic charge of an attractive nature to the first electrostatic charge; positioning the substance with the second electrostatic charge using said evanescent interference pattern grid in a planned manner on the substrate so as to form a photonic crystal. As encompassed by the present invention, is a photonic crystal formed by such method.

In yet another embodiment of the present invention, there is provided a method for introducing a controlled local variation into a photonic crystal produced by the positioning of material comprising the photonic crystal in a planned manner using a evanescent light interference pattern grid, the method comprising: employing a coherent light beam to block out certain points in the evanescent light interference pattern grid when the photonic material comprising the photonic crystal is being positioned so as to inhibit deposition of the photonic crystal material at such points; and introducing an impurity other than the photonic material comprising the photonic crystal into the photonic crystal at the such points. Also asserted is the photonic crystal formed by such method. In further refinement of such method, the impurity may comprise a polymeric material that is degradable under conditions wherein the photonic material comprising the photonic crystal is not. The impurity may be smaller, larger or, more preferably, about the same size as the material comprising the photonic crystal.

Yet a further embodiment of the present invention comprises a process for generating a photonic crystal, the process comprising the steps of: applying a photonically-active polycation to a substrate to form a positively charged substrate; generating a light interference pattern grid on the substrate; positioning a photonically-active anionic material on the substrate using the light interference pattern grid so as to form a photonic crystal. The photonic crystal formed by such process is also asserted as an embodiment of the present invention. In a preferred embodiment employing such process, the photonically-active polycation of such process is selected from the group consisting of: (a) polyethylene imine and (b) polyethylene imine functionalized with chemical moieties such that the polyethylene imine has further polycationic electrooptic properties and such that the charge of the polyethylene imine can be altered upon light irradiation. The photonically-active anionic material may be colloidal $SiO_2$ spheres. The positioned photonically-active anionic material may be further reacted with an inorganic material capable of promoting formation of an inorganic salt bridge.

And yet further, there is provided as an embodiment of the present invention a process for generating a photonic crystal, the process comprising the steps of: applying a photonically-active polyanionic substance to a substrate to form a negatively charged substrate; generating a light interference pattern grid on the substrate; and positioning a cationic photonically-active material on the substrate using the light interference pattern grid so as to form a photonic crystal. A photonic crystal made by such process is also asserted as an embodiment of the present invention.

An yet further, there is provided as an embodiment of the present invention a process for generating a photonic crystal, the process comprising the steps of: (a) applying cationically-charged photonically-active material to a substrate capable of binding the cationically-charged photonically-active material to form a positively-charged surface on the substrate; (b) rinsing non-bound cationically-charged photonically-active material from the positively-charged surface on the substrate; (c) applying anionically-charged micro and/or meso photonic particles to the positively-charged surface of the substrate in a predetermined fashion using a light interference pattern grid to induce ordered-binding of the anionically-charged micro and/or meso photonic material to the positively-charged surface of the substrate so as to form a negatively-charged surface on the substrate; (d) rinsing non-bound anionically-charged micro and/or meso photonic material from the negatively-charged surface of the substrate; (e) applying cationically-charged photonically-active material to the negatively-charged surface of the substrate to form a second positively-charged surface on the substrate; (f) rinsing non-bound cationically-charged photonically-active material from the second positively-charged surface on the substrate; and (g) repeating steps (a)–(f) for each additional layer desired in the photonic crystal. The photonic crystal formed by such process is also claimed as an embodiment of the present invention.

A primary advantage of the present invention is that it may provide an efficient way to manufacture large-scale photonic crystals at significantly lower expense than prior art techniques. The present inveniton permits the formation of photonic single crystals having sizes larger than those available with the prior-art, without microcrystallization domains, forming crystal grains that are non-registered with respect to each other. Other advantages of the present invention will become apparent in view of the following detailed description of the preferred embodiments and the accompanying drawings.

DETAILED DESCRIPTION OF THE PREFERRED EMBODIMENTS

The present invention defines a process (and the crystal produced thereby) wherein the self-ordering of submicron "monodispersed" (narrow dispersion of sizes) spheres are assembled with the assistance of an optically defined lattice capable of maintaining a single crystal orientation over substantial distances. The invention permits photonic crystals to be fabricated from a wider variety of materials than possible under the prior art and permits single photonic crystals to be formed in a size larger than available under the prior art. The process for forming photonic crystals of the present invention also proffers the ability to produce photonic crystals at significantly lower expense than prior art processes.

Figure 1:
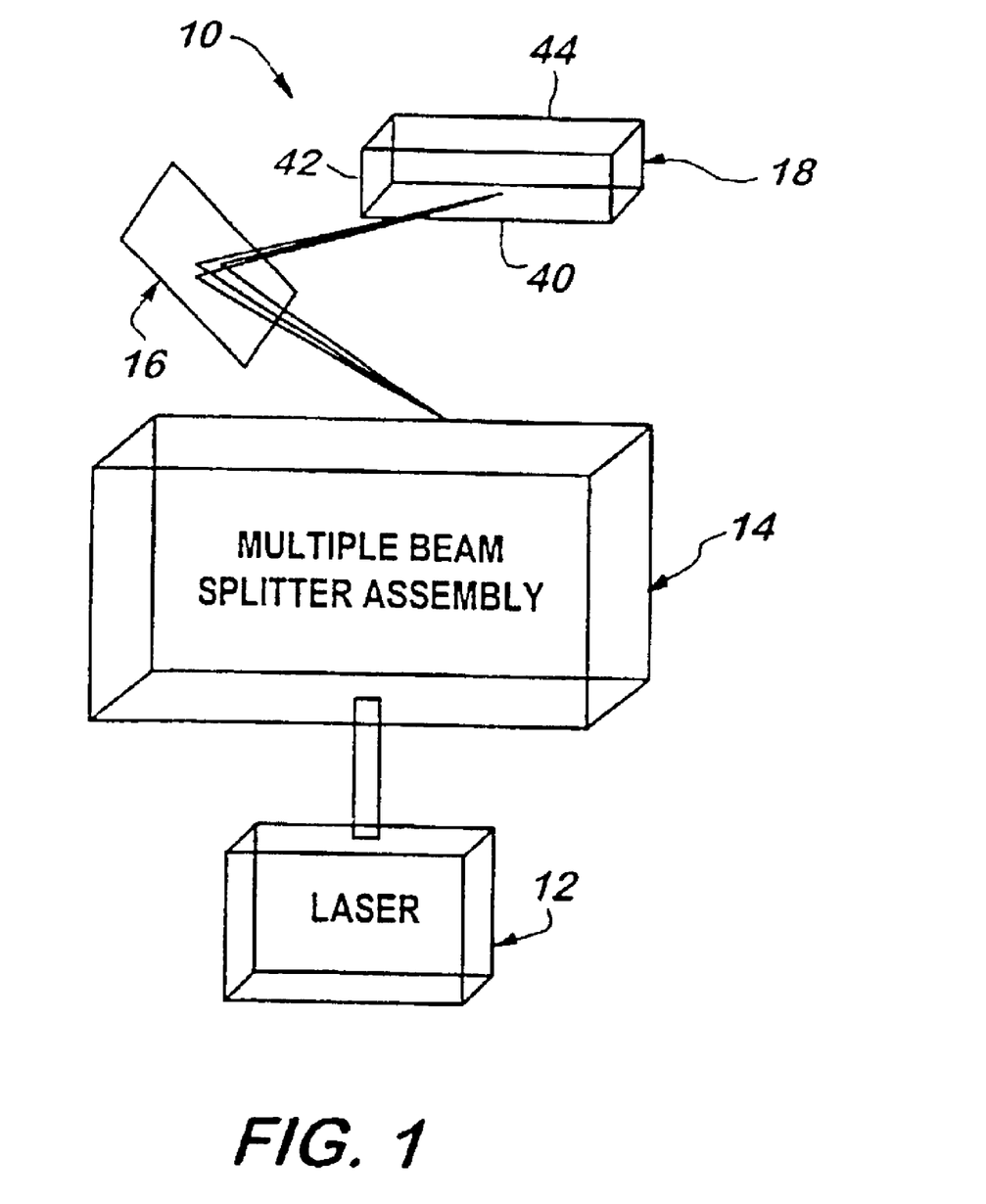
FIG. 1 is a schematic illustration of a first preferred embodiment of an apparatus for creating a 3-D optical lattice interference pattern within a sample cell.
Figure 2:
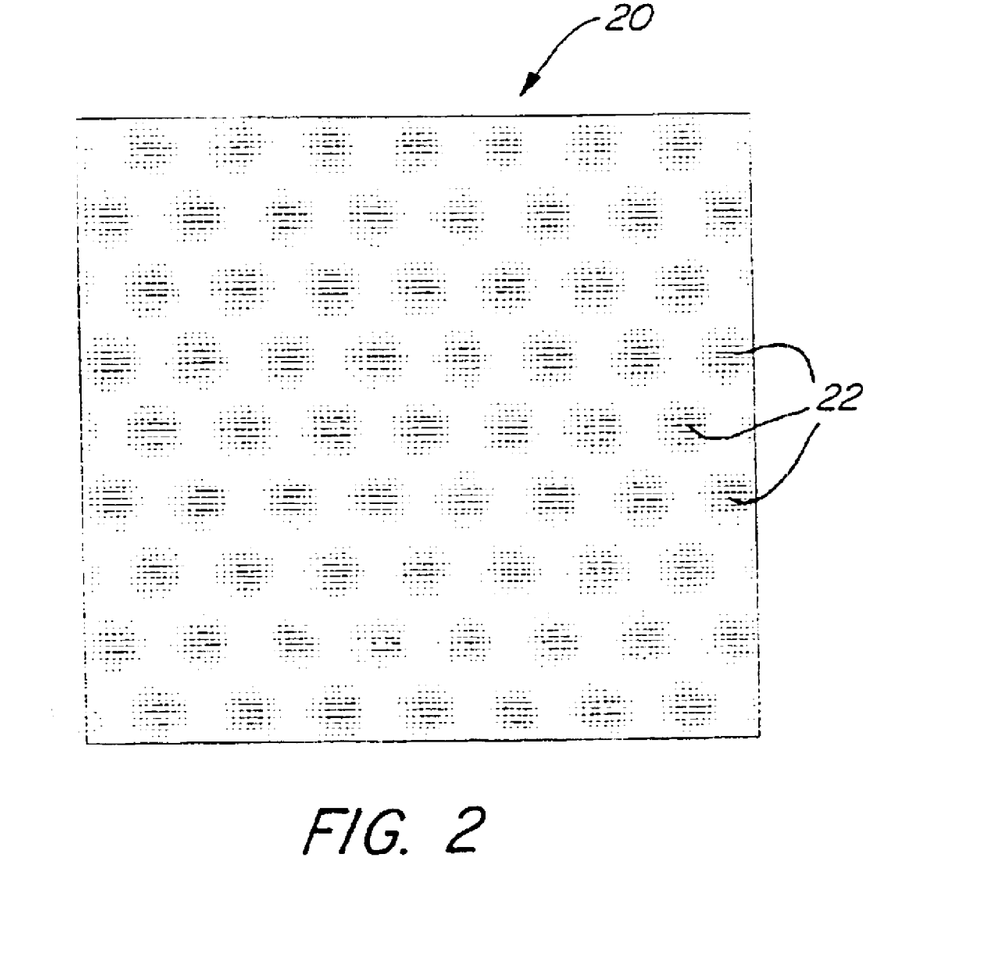
FIG. 2 is a two-dimensional top view of the interference pattern produced within the sample cell by the apparatus of FIG. 1.
Figure 3:
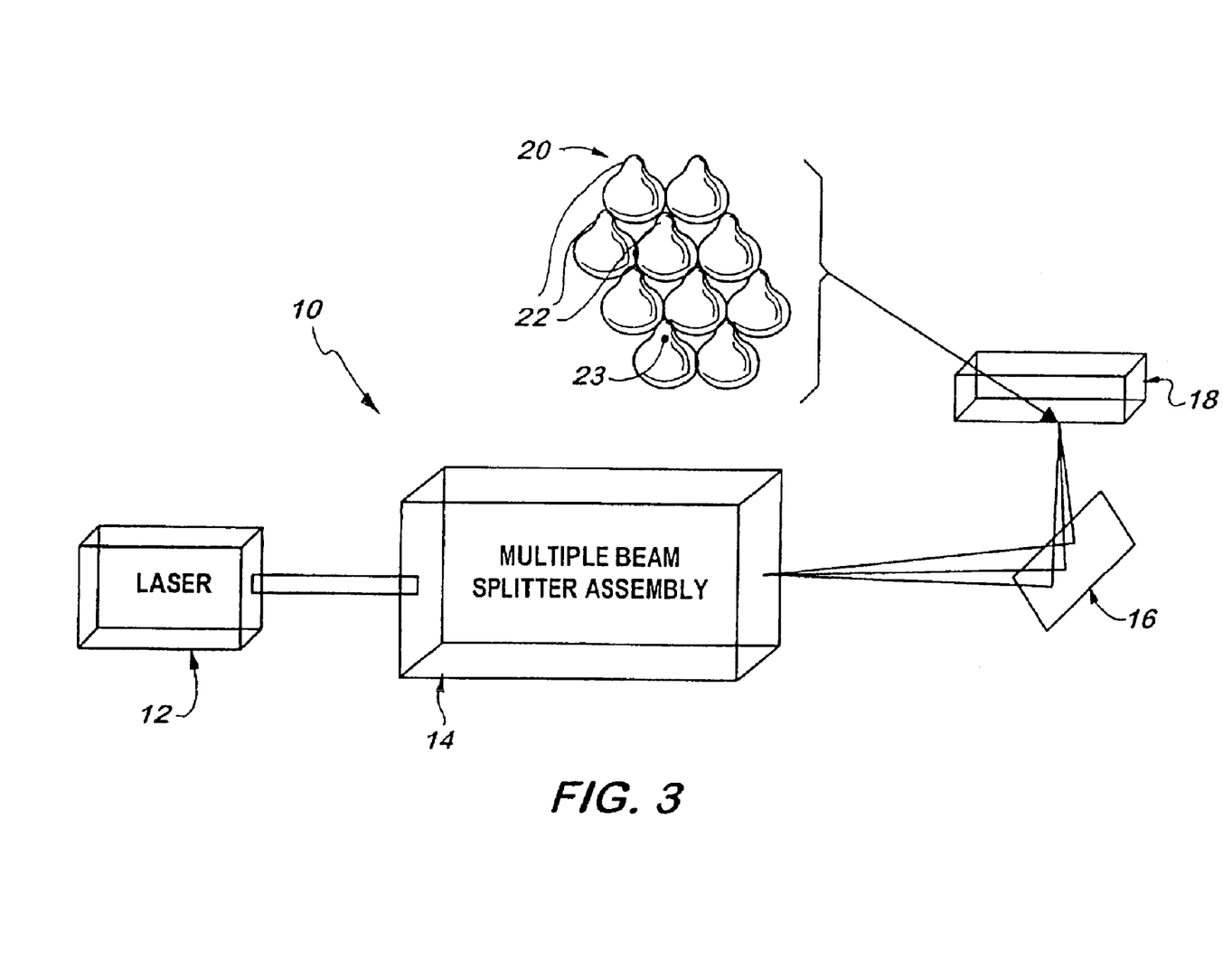
FIG. 3 is a schematic elevational view of the apparatus of FIG. 1, including a perspective breakaway view of the interference pattern of FIG. 2.

In FIGS. 1 and 3, one embodiment of the photonic crystal fabrication apparatus of the present invention is indicated generally by the reference numeral 10. The photonic crystal fabrication apparatus 10 comprises a LASER or other coherent light source 12, a multiple beam splitter assembly 14 optically coupled to the light source 12 to divide the beam produced by the light source into at least three separate coherent beams, a multi-mirror assembly 16 optically coupled to the splitter assembly 14 to direct the three beams towards each other, each at a relative interference angle of about 120 degrees with respect to the others to thereby form a high intensity lattice or light interference pattern, and a sample cell 18 optically coupled to the multi-mirror assembly 16 for receiving the light interference pattern produced by the interference of the three incident coherent beams. The sample cell 18 is defined by a glass base or other transparent surface 40 for receiving from beneath the base the light interference pattern, and for containing a plane of evanescent light within the base. The base 40 is connected along its edge to a side wall 42. A removable top 44 is connected to the side wall 42 for enclosing the sample cell 18. In FIG. 1, the photonic crystal fabrication apparatus uses three coherent beams interfering at 120° with respect to each other to establish a hexagonal evanescent interference pattern where the spatial light intensity is shown in FIG. 2.

In FIG. 2, a top view of the light interference pattern of the high intensity lattice produced by the apparatus of FIGS. 1 and 3 is indicated generally by the reference numeral 20. The light interference pattern 20 comprises points of high intensity light 22 aligned in a periodic raster arrangement in a given horizontal plane. This light interference 20 pattern is introduced into a colloidal suspension of uniform-sized particles, such that the evanescent pattern act as a lattice of optical tweezers to create the first coherent deposited layer. With the help of the well known electrostatic self-assembly methodology, the first layer of spheres (e.g. SiO$_2$, 300 nm, with negative surface charge) may be immobilized on a prior functionalized cationic substrate. In addition, modification of the cationic polymer with functional groups that provide certain electrooptic properties, may further improve immobilization of the uniform-sized particles on the surfaces by locally modifying its surface charge upon irradiation. This will establish a first well-controlled free-form 2-D periodic layer. Particles that reside on top of this layer may be unbonded and thus easily removed in subsequent processes. By controlling the complex refractive index of the first layer, the second layer may also produced in the same manner described for the first layer, and may include defects that coordinate to produce the desired overall structure. This may be repeated for as many layers as required to produce the 3-D single crystal periodic structure. By further controlling the position of the interference pattern, the second and subsequent layers can be produced with a desired horizontal relationship to the underlying layers, with defects that coordinate to produce the desired overall defect structure. This is then repeated for as many layers as required to produce the 3-D single crystal periodic structure with well-defined 3-D defects. Thus, for example, the individual spheres of the second and subsequent layers may be horizontally displaced from those of the preceding layer and be placed halfway between the underlying spheres, directly above the underlying spheres, or at any intermediate horizontal displacement or not. In this way the fcc symmetry of the natural opal can be broken, and structures with diamond or other symmetries can be fabricated.

In FIG. 3, the photonic crystal fabrication apparatus 10 of FIG. 1 is shown with a close up perspective of the light interference pattern 20 of FIG. 2. The points of high intensity light 22 are seen to be approximately conical in outline, with a point 23 at about the geometric center of each cone having the highest light intensity. FIG. 3 illustrates an optically defined lattice along with the laser optics required to produce the lattice. In the embodiment illustrated in FIG. 3, a primary laser beam, or other coherent light source, is split into three secondary beams that are allowed to recombine with controlled phase change to create the 3-D optical interference lattice. The individual optical lattice points work as an optical tweezers to localize the individual particles on the lattice cite.

Figure 4:
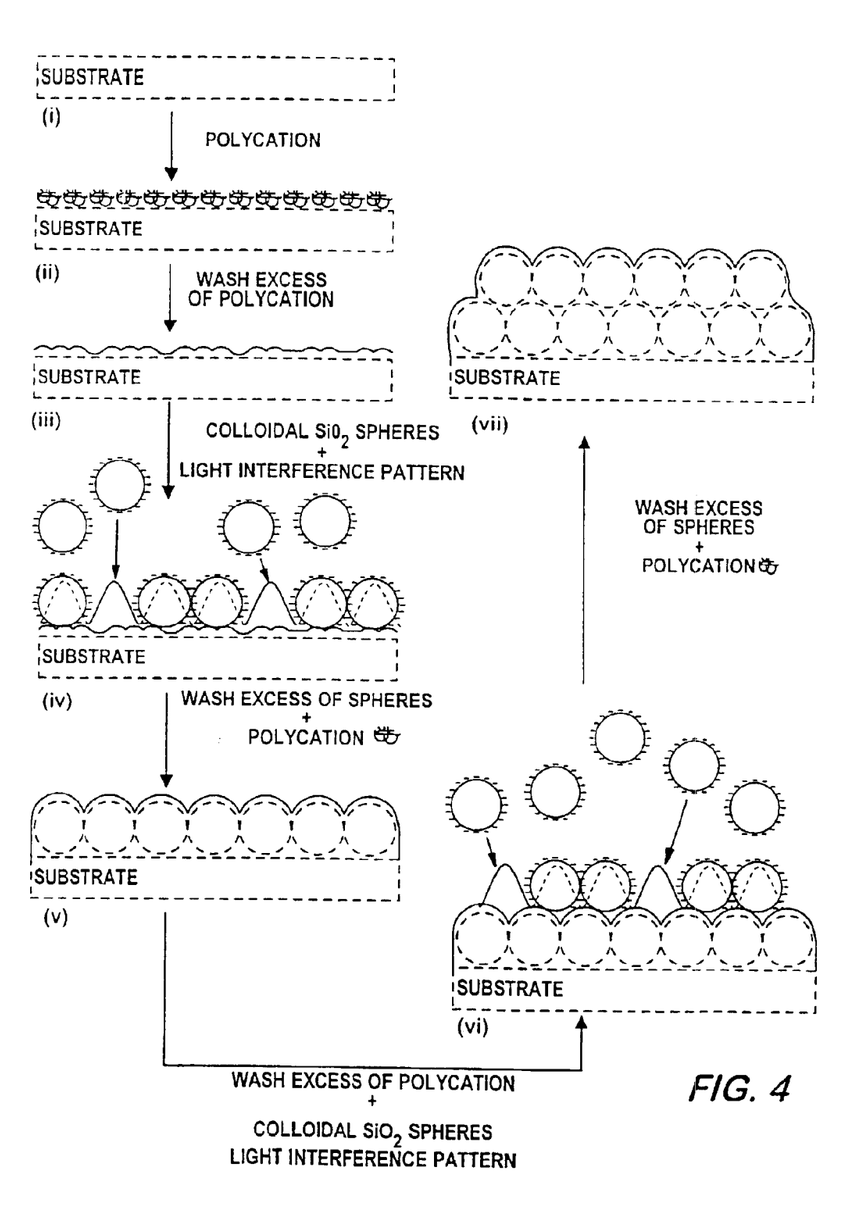
FIG. 4 is a schematic process step diagram of a method for using the apparatus of FIGS. 1 and 3 to produce a photonic crystal.

In FIG. 4, a process step diagram is indicated for using the apparatus of FIGS. 1 and 3 to produce a photonic crystal. In step (i), polycation such as, for example, polyethylene amine (PEA), is applied to a substrate. This polycation may be functionalized with a variety of functional groups that possess certain electrooptic effects and can alter their surface charge upon exposure to light. In step (ii), the excess polycation is removed or washed away such as by flushing with distilled water, ethanol, or other suitable liquid. Step (iii) comprises adding colloidal SiO$_2$ spheres and applying the light interference pattern. Step (iv) comprises removal of the excess spheres, such as by flushing with distilled water, ethanol, or other suitable liquid, and application of polycation. Step (v) comprises removal of the excess polycation, such as by flushing as above, addition of colloidal SiO$_2$ spheres, and application of the light interference pattern. Step (vi) comprises removal of the excess spheres, and addition of polycation.

Figure 5A:
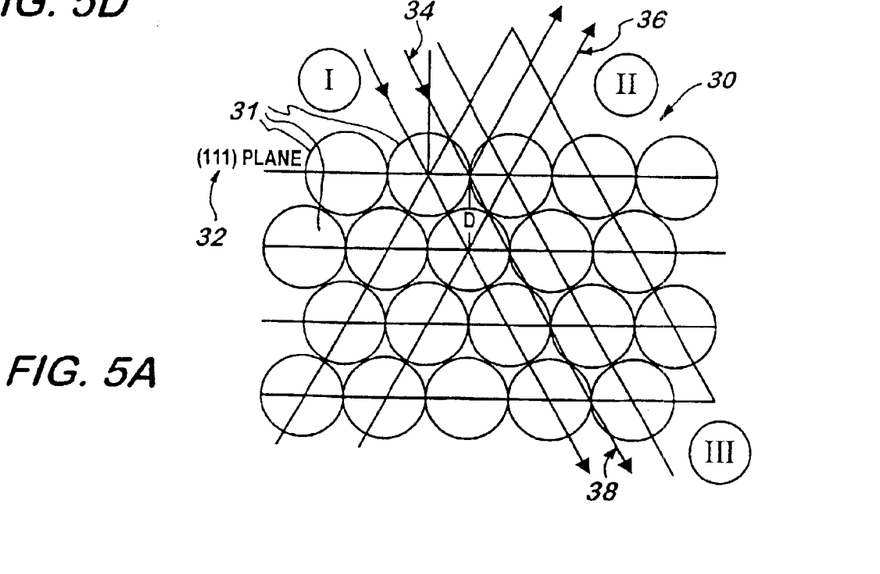
FIG. 5A is an elevational side view of a photonic crystal as may be produced by the process of FIG. 4.
Figure 5B:
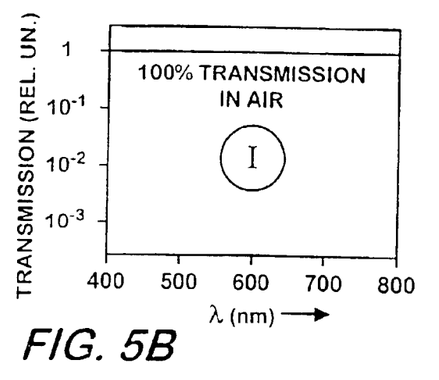
FIGS. 5B–5D are relative light intensity spectral graphs for the incident light, the diffracted light, and the transmitted light, respectively, of the photonic crystal of FIG. 5A.
Figure 5C:
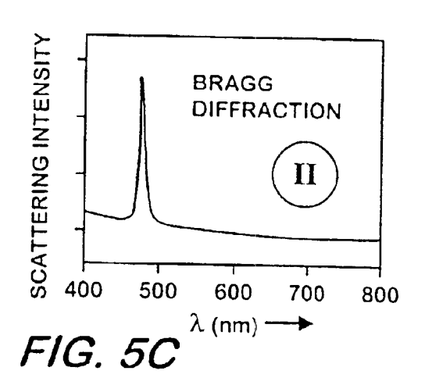
Figure 5D:
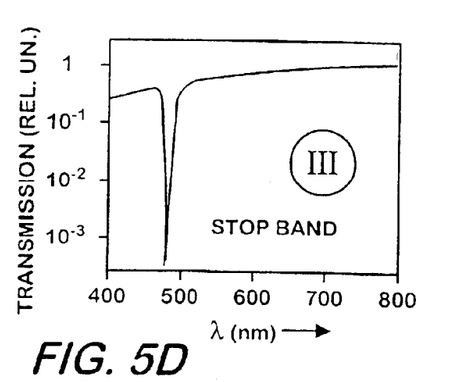

Now turning to FIGS. 5A–5D. An embodiment photonic crystal that may be produced by the method of FIG. 4, using the apparatus of FIGS. 1 and 3, is indicated generally by the reference numeral 30 in FIG. 5A. FIGS. 5B–5D depict graphically the light transmission intensity for the incident light (FIG. 5B), the diffracted light (FIG. 5C), and the transmitted light (FIG. 5D), respectively, of the exemplary photonic crystal 30 of FIG. 5A. Examplary photonic crystal 30 is made up of colloidal SiO$_2$ spheres 31 of approximately uniform submicron size, and comprises an upper "111" plane or layer 32. An incident light beam 34, having the spectrum indicated in FIG. 5B, intersects the "111" plane 32 at an incident angle phi relative to the normal to the plane 32. The interplanar distance "D" is the distance between the planes of the crystal. The light diffracted by the crystal is indicated by the reference numeral 36, and has the spectrum indicated in FIG. 5C. The light transmitted through the crystal, indicated by the reference numeral 38, has the spectrum indicated in FIG. 5D relative to the incident beam 34. For example, given the exemplary interplanar distance D corresponding to a Bragg Diffraction peak of about 500 nm, a component of an incident beam 34 comprising 700 nm wavelength light would pass through the crystal virtually unattenuated, while a component of an incident beam 32 comprising 500 nm wavelength light would be substantially reflected by the photonic crystal. The formula that relates the interplanar distance D to the stop band wavelength λ is:

$$\lambda = \frac{2D}{m}[n^2 - \sin^2(\phi)]^{1/2}$$

where n is the composite refractive index, and m is a positive integer.

Figures 6A, 6B, 6C:
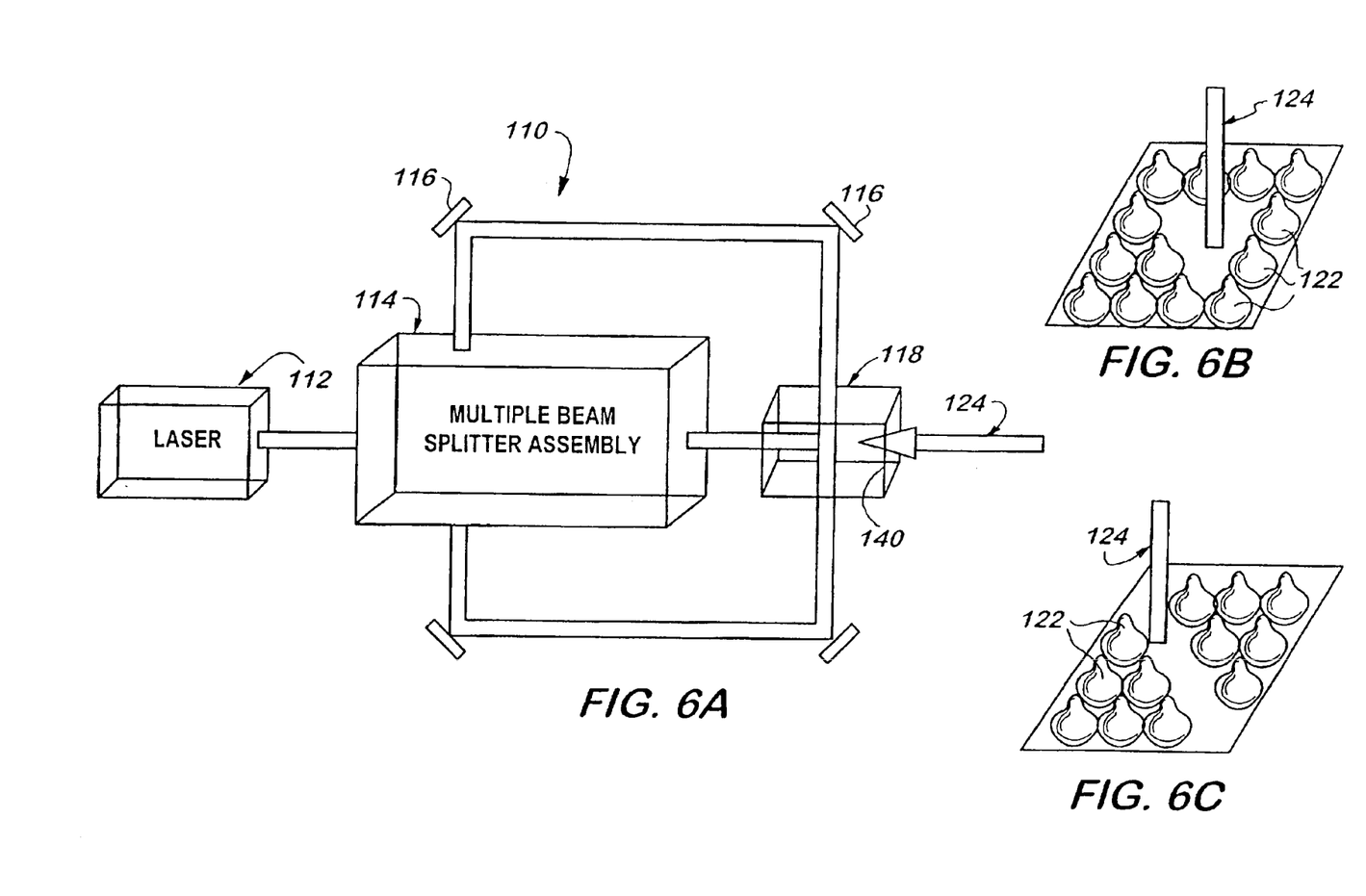
FIG. 6A is a schematic bottom view of a second apparatus for creating a 3-D optical lattice interference pattern within a sample cell.
FIGS. 6B and 6C are each perspective views of a layer of manipulated interference patterns within the sample cell of FIG. 6A.

Turning to FIGS. 6A–6C, a second embodiment of the photonic crystal fabrication apparatus of the present invention is indicated generally by the reference numeral 110 in FIG. 6A. The photonic crystal fabrication apparatus 110 is substantially similar to the photonic crystal fabrication apparatus 10 of FIGS. 1 and 3, and therefore like elements and features are designated with like numbers preceded by the numeral "1". The photonic crystal fabrication apparatus 110 differs from the photonic crystal fabrication apparatus 10 in its provision for optical receipt of one or more coherent manipulating holographic or coherant beams 124, optically coupled to base 140 of sample cell 118 and received from below base 140. The manipulating beams 124 comprise coherent light and operate to cancel the high intensity points of the interference pattern at which they are aimed. FIGS. 6B and 6C illustrate exemplary manipulated light interference patterns having points of light 122 and manipulating beams 124 projecting upwardly from beneath the base 140. The manipulating beams may be used to alter the interference pattern to include controlled local variations in the lattice (so-called "defects") in a 2-D periodic structure. The defect pattern can be produced in a periodic manner, utilizing, for example, holographic imaging, to manipulate the additional beams.

By controlling the surface chemistry, one can permit only the "sticking" of the first ordered layer creating a two dimensional photonic crystal with controlled defects. The chemistry can also be changed or modified to allow growth on the third dimension as well. Growth is dictated on the intrinsic diffraction of the optical lattice associated with the first or preceding layer, and continues as well for subsequent layers. The combination of single layers and controlled defects enables construction of composite structures at a micro/meso level. A number of variations can be provided with this approach such as metal, semiconductor, and polymer infiltration techniques to construct inverse opal structures as well as unique composites with mesoscale crystalline order. Incorporation of waveguides and sacrificial patterned structures can stimulate a number of additional hierarchical structures with various photonic crystal, mechanical, physical and other materials properties. Subsequent to creation of the defects in the first layer, the defects maybe filled with a sacrificial material, such as, for example, polystyrene or any polymer or other optically transparent compound susceptible to heat, which may be removed by melting and/or vaporization after the full 3-D structure is created.

Figure 7A:
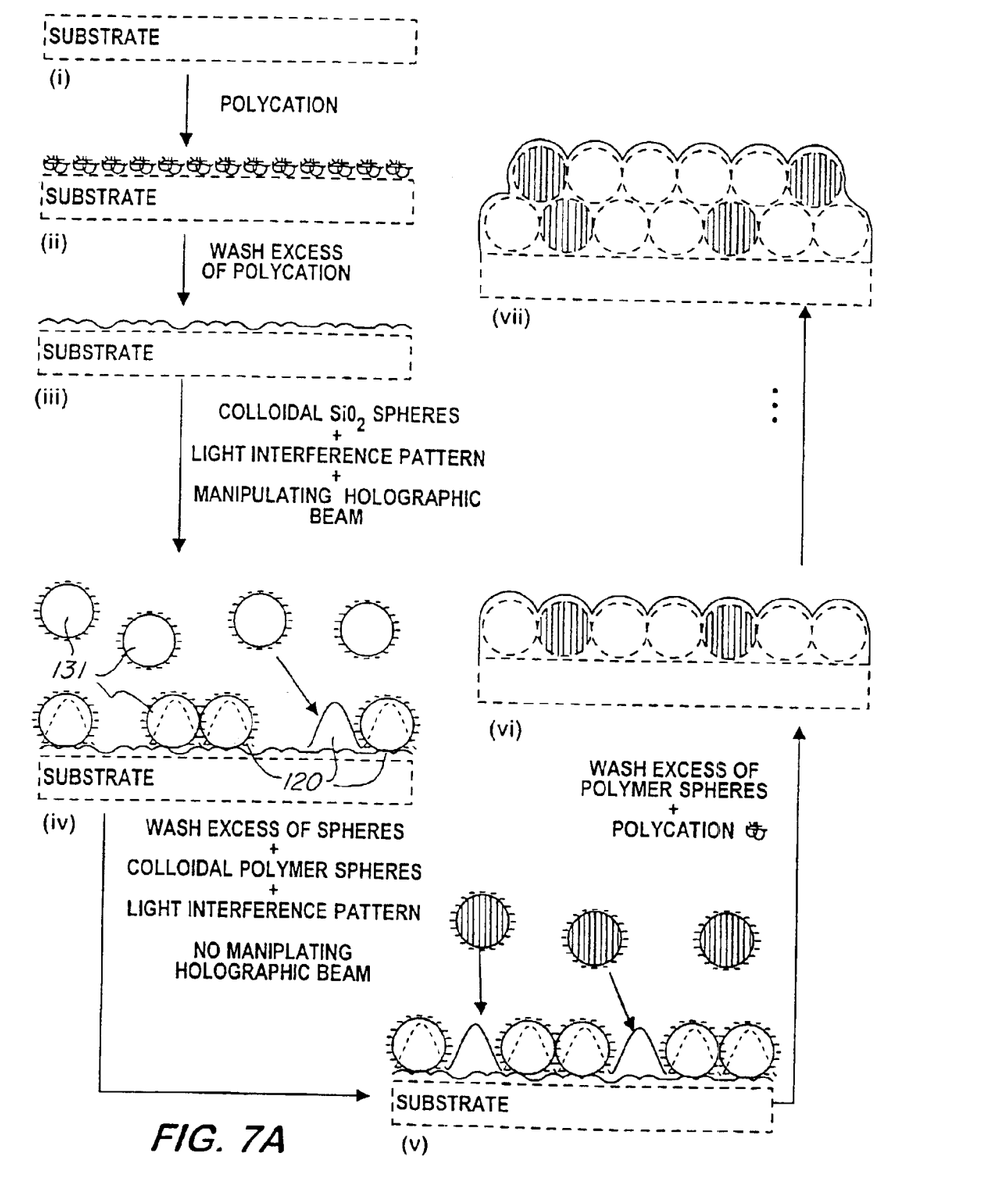
FIG. 7A is a schematic process flow diagram of a method for using the apparatus of FIG. 6A to produce a photonic crystal having controlled local variations.
Figure 7B:
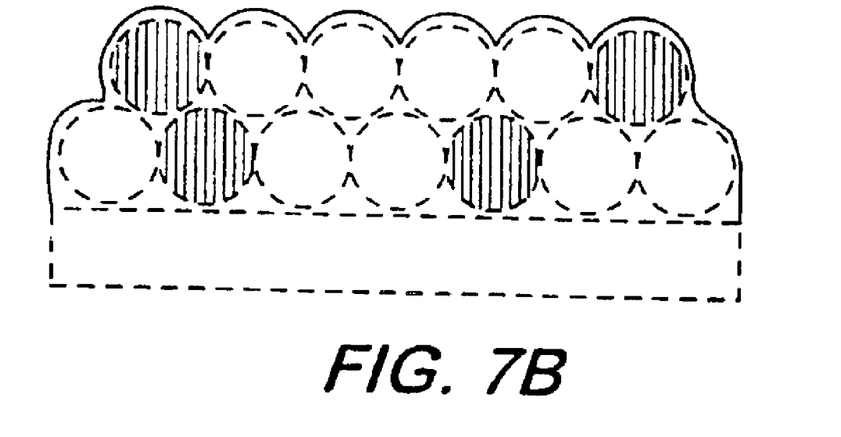
FIG. 7B is a cross-sectional elevational view of a representative first two layers of the photonic crystal of FIG. 7A.
Figure 7C:
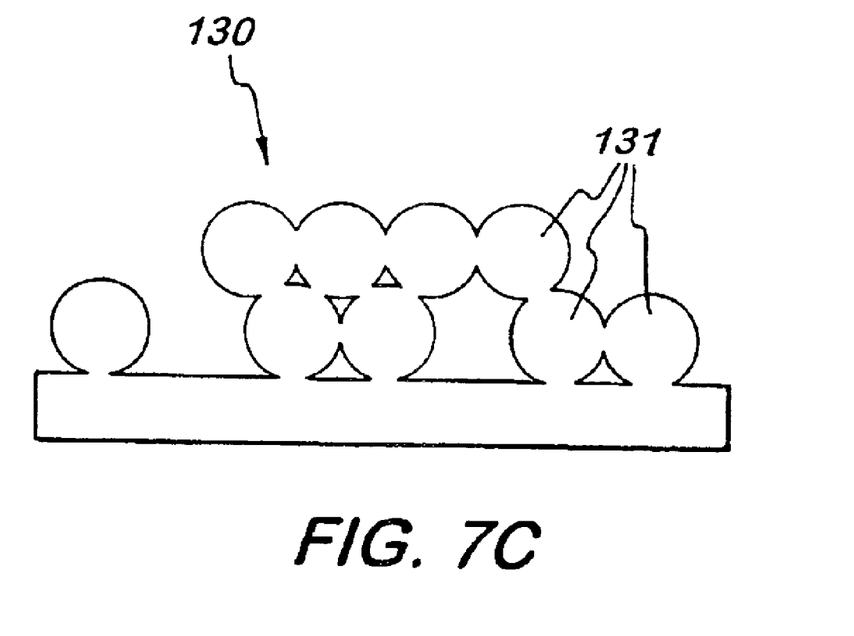
FIG. 7C is a cross-sectional elevational view of a representative first two layers of the photonic crystal of FIG. 7B subsequent to purification and sintering.

In FIGS. 7A–7C, a process step diagram is indicated for using the apparatus of FIG. 6A to produce a photonic crystal having intentional defects. In step (i), polycation is applied to a substrate. In step (ii), the excess polycation is removed or washed away such as by flushing with distilled water, ethanol, or other suitable liquid. Step (iii) comprises adding colloidal $SiO_2$ spheres 131, applying the light interference pattern 120, and applying the manipulating holographic beams. Step (iv) comprises removal of the excess spheres such as by flushing with distilled water, ethanol, or other suitable liquid, followed by addition of colloidal polymer spheres, and application of the light interference pattern without any manipulating beams. Step (v) comprises removal of the excess polymer spheres and application of polycation. Step (vi) comprises repeating steps (ii) through (v) for each additional layer desired. FIGS. 7B and 7C illustrate two alternative embodiments of the first two layers of the photonic crystal of FIG. 7A which may be produced using the methods described herein. By modifying step (vii) of FIG. 7A such that the crystal is heated to a temperature most preferably between 400 and 700 degrees centigrade, the structure of FIG. 7B can be altered to that of FIG. 7C by effectuating calcination or removal of organic compounds and sintering of the $SiO_2$ spheres 131. This heat-treating process removes all polymeric materials by thermal decomposition while sintering the $SiO_2$ glass spheres into a photonic crystal 130 having well defined intentional defects.

In FIGS. 8A and 8B, scanning electron micrographs of a fractured surface of prior art photonic crystal are illustrated. Magnification in FIG. 8A is 1 $\mu$m per inch, while that in FIG. 8B is 10 $\mu$m per inch. Such structures illustrate undesirable microcrystallization domains, forming crystal grains non-registered with respect to each other. Microcrystal domain 26 comprises spheres 31 and has a first orientation, and a microcrystal domain 28 is physically connected to microcrystal 26 but has a second orientation different from that of microcrystal 26. Such organization of the spheres defines microcrystallization within the structure and is generally undesirable.

The present invention further includes the surface chemistry to stabilize and hold in place the structure created by the optical lattice. FIGS. 9A–9B and 10A–10B illustrate two different approaches to stabilization of the photonic crystal.

Figure 9A:
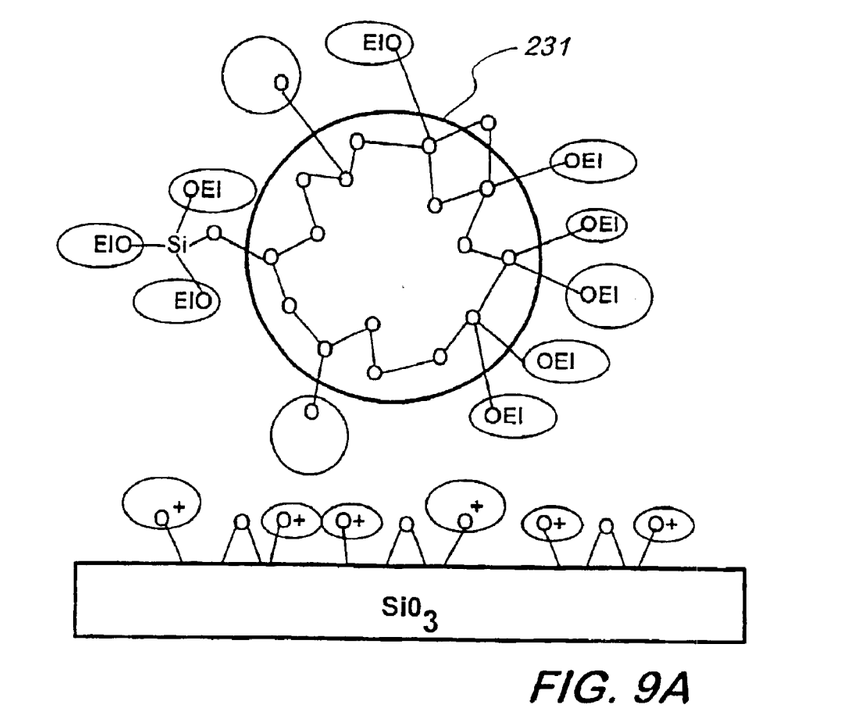
FIGS. 9A and 9B are elevational side views of a representative silica sphere before and after self-assembly stabilization, respectively.
Figure 9B:
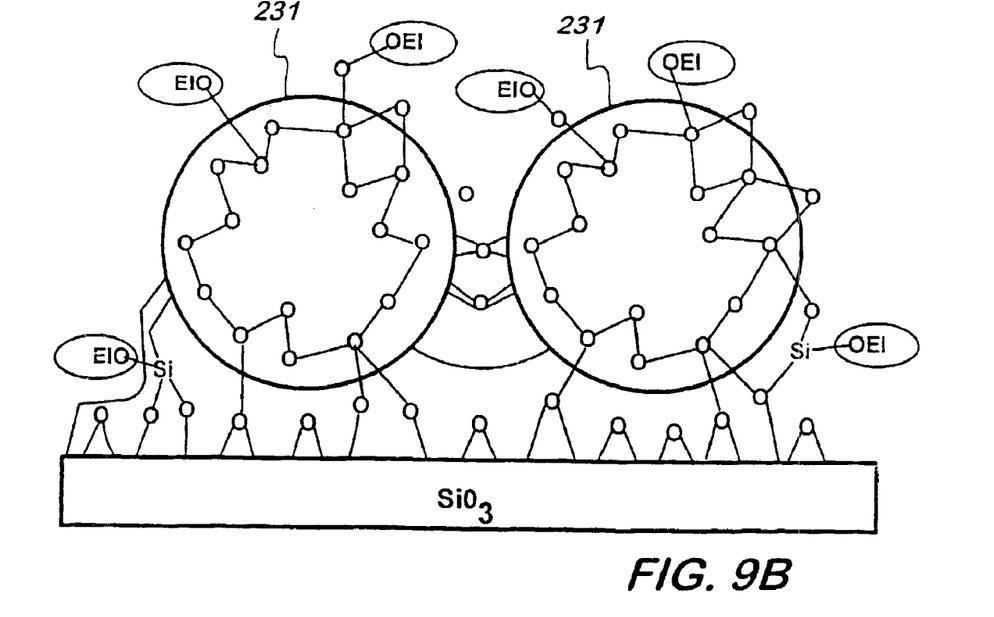

In FIGS. 9A and 9B, there is presented elevational side views of embodiment silica spheres before and after self-assembly stabilization, respectively. Taken in conjunction with each other, they represent an embodiment of the present invention wherein $SiO_2$ sphere 231 is subjected to a pH of about 2.5 in order to stabilize its self-assembly with an adjacent $SiO_2$ sphere 231.

Figure 10A:
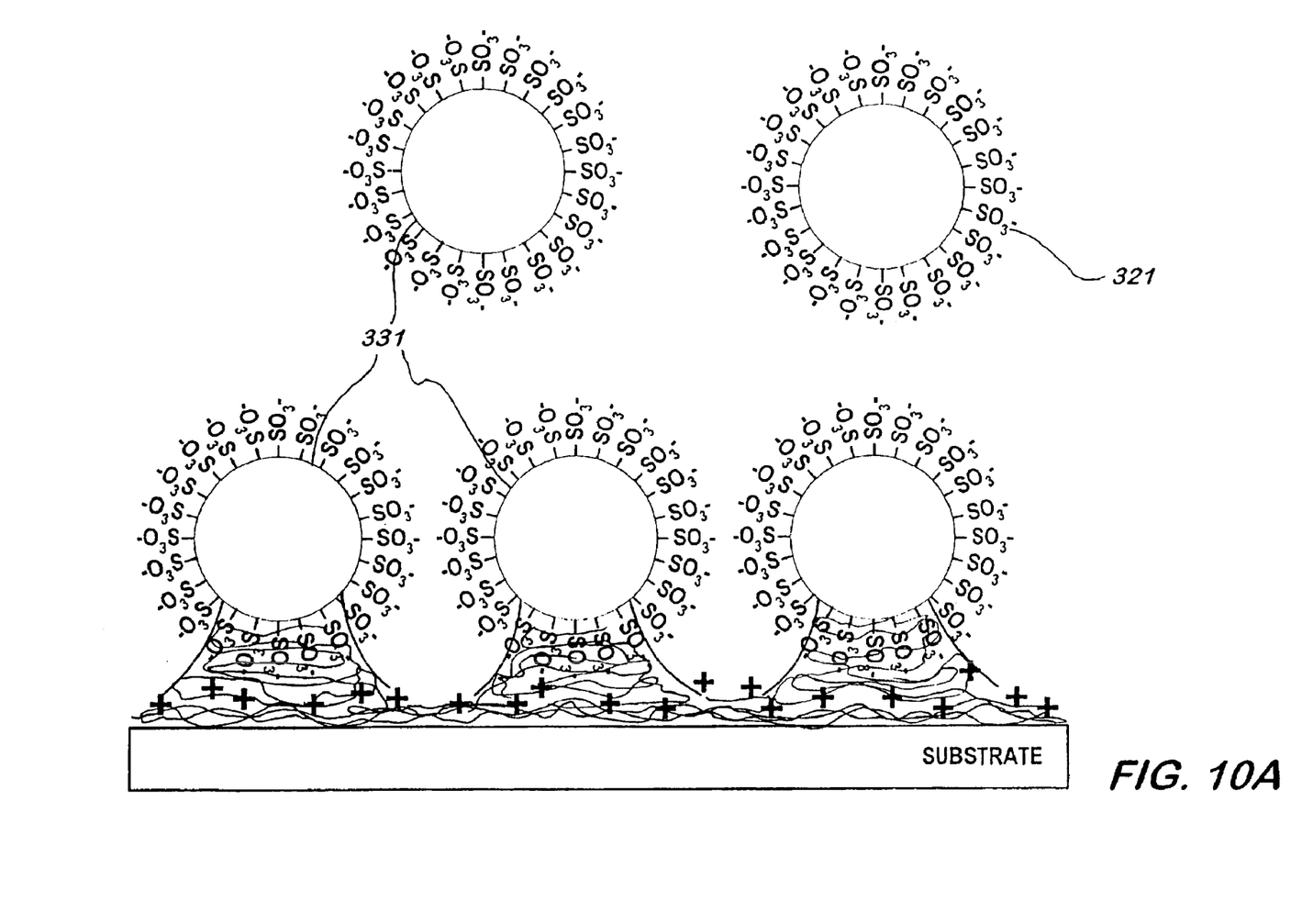
FIGS. 10A and 10B are elevational side views of representative spheres before and after final layer stabilization by inorganic salt bridge formation, respectively.
Figure 10B:
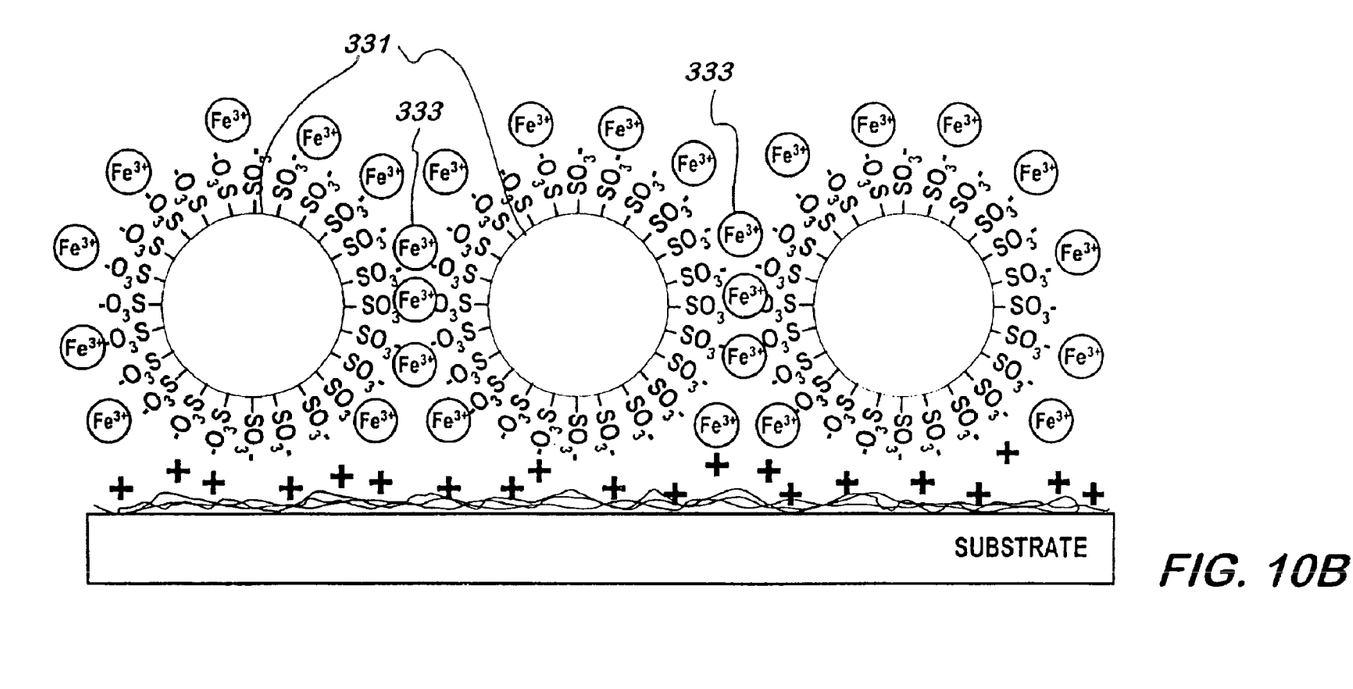

In FIGS. 10A and 10B, there is presented elevational side views of embodiment spheres before and after final layer stabilization by inorganic salt bridge formation, respectively. Taken in conjunction, such figures illustrate an embodiment of the present invention wherein spheres 331 are subjected to an inorganic ethanolic salt solution comprising $FeCl_3$, $ZnCl_2$, or similar compound in order to promote formation of inorganic salt bridges 333.

In operation, a photonic crystal or synthetic opal having a large scale single crystal organization of spheres may be formed by applying coherent light to form a light interference pattern that is aimed at the base of the sample cell. Spheres are added to the sample cell and are held in place at the points defined by the interference pattern. The excess spheres are washed away and the remaining spheres are fixed in place via addition of polycation prior to removal of the interference pattern. Where controlled local variations or defects are desired, one or more manipulating beams block out certain points in the interference pattern so that the primary spheres do not locate in those positions. Filler spheres are directed to the defect positions via re-application of the interference pattern without any manipulating beam. Excess spheres are washed away and polycation is added to the sample cell in order to fix each layer of spheres prior to relocation of the interference pattern to form the next layer.

Subsequent to creation of the 3-D composite structure, post treatments such as, for example, washing and/or heating, are used to remove the sacrificial material. This also permits the creation of an inverse structure by infiltration with metals, ceramics or polymeric materials, designed to meet specific device applications.

The structures of the present invention may revolutionize the present optoelectronics and photonics industries. For example, localizing light within diffracting walls promises to deliver novel wave guiding materials (where light can be bent without loss over tight 90° bends) zero threshold lasers, novel electro-optic devices and eventually all-optical computers. In addition, such structures can be employed in specialized mirror technologies, fiberoptic communication conduits and devices, advanced directional sensors and novel actuators.

As would be understood by one of ordinary skill in the art, a number of variations can be provided in accordance with the present invention such as metal and polymer infiltration techniques to construct inverse opal structures as well as crystal composites. For example incorporation of waveguides and sacrificial patterned structures can stimulate a number of additional hierarchical structures with various photonic crystal, mechanical, physical and other material properties. Further different materials may be added or substituted for the $SiO_2$ spheres disclosed herein, such as other glasses and photonically active materials, in order to produce photonic crystals from numerous base materials and to suit numerous applications. Further coherent electromagnetic beams having numerous different wavelengths may be added or substituted for the beams of coherent light disclosed herein, in order to produce photonic or comparable crystals from alternate base materials to suit numerous other applications.

As would further be recognized by those skilled in the pertinent art based on the teachings herein, numerous other changes may be made to the above described and other embodiments of the present invention without departing from its scope or spirit as defined in the appended claims. For example, alternate or supplemental devices capable of redirecting coherent light, such as fiber-optic devices, may be used in lieu of the multi-mirror assembly disclosed herein for exemplary purposes. Similarly, the particular hardware used to produce the coherent light may be other than LASER devices, as now or later to become known in the pertinent art, and may comprise more than one such device pre-aimed in the appropriate direction in order to obviate the need for light redirection devices. In addition, methods for altering the interference pattern between subsequent layers of spheres may include, in addition to application and/or redirection of manipulating beams, adjusting the multi-mirror assembly, displacement of the sample cell itself, displacement of the coherent light production apparatus, or adjustment of the parameters of the coherent light itself.

Accordingly, the detailed description of preferred embodiments is to be taken in an illustrative as opposed to a limiting sense.

References

1. A. Blanco, E. Chomski, S. Grabtchak. M. Ibisate, S. John, S. W. Leonard, C. Lopez, F. Meseguer, H. Miguez, J. P. Mondia, G. A. Ozin, O. Toader and H. M. van Driel, *Large-scale synthesis of a silicon photonic crystal with a complete three-dimensional bandgap near 1.5 micrometres*, Nature 405, 437 (2000).
2. John, S., *Strong localization of photons in certain disordered dielectric superlattices*, Phys. Rev. Lett., 58, 2486, (1987).
3. M. Trau, D. A. Saville, and I. A. Aksay, *Field-induced layering of colloidal crystals*, Science, 272, 706 (May 3, 1996) (Abstract).

What is claimed is:

1. A method for fabricating a photonic crystal, comprising the steps of:
    producing a first beam of coherent light;
    generating a second and third beam of coherent light each in a fixed phase relationship with said first beam;
    aligning said beams of coherent light so as form a fixed relative angle of incidence between each pair of beams and to form an evanescent light interference pattern grid on a substrate having a first electrostatic charge;
    introducing into said evanescent light interference pattern grid a substance having a second electrostatic charge of an attractive nature to said first electrostatic charge;
    positioning said substance with said second electrostatic charge using said evanescent interference pattern grid in a planned manner on said substrate so as to form a photonic crystal.

2. A photonic crystal formed by the method of claim 1.

3. A method for introducing a controlled local variation into a photonic crystal produced by the positioning of material comprising the photonic crystal in a planned manner using a evanescent light interference pattern grid, said method comprising:
    employing a coherent light beam to block out certain points in the evanescent light interference pattern grid when the photonic material comprising the photonic crystal is being positioned so as to inhibit deposition of the photonic crystal material at such points; and
    introducing an impurity other than the photonic material comprising the photonic crystal into said photonic crystal at the such points.

4. The method of claim 3 wherein the impurity comprises polymeric material that is degradable under conditions wherein the photonic material comprising the photonic crystal is not.

5. A photonic crystal formed by the process of claim 3.

6. The method of claim 3 wherein the impurity is about the same size as the material comprising the photonic crystal.

7. A process for generating a photonic crystal, said process comprising the steps of:
    applying a photonically-active polycation to a substrate to form a positively charged substrate;
    generating a light interference pattern grid on said substrate;
    positioning a photonically-active anionic material on said substrate using said light interference pattern grid so as to form a photonic crystal.

8. The process of claim 7 wherein the photonically-active polycation is selected from the group consisting of: (a) polyethylene imine and (b) polyethylene imine functionalized with chemical moieties such that the polyethylene imine has further polycationic electrooptic properties and such that the charge of the polyethylene imine can be altered upon light irradiation.

9. The process of claim 7 wherein the photonically-active anionic material is colloidal $SiO_2$ spheres.

10. The process of claim 7 wherein the positioned photonically-active anionic material is further reacted with an inorganic material capable of promoting formation of an inorganic salt bridge.

11. A photonic crystal formed by the process of claim 7.

12. A process for generating a photonic crystal, said process comprising the steps of:
    applying a photonically-active polyanionic substance to a substrate to form a negatively charged substrate;
    generating a light interference pattern grid on said substrate;
    positioning a cationic photonically-active material on said substrate using said light interference pattern grid so as to form a photonic crystal.

13. A photonic crystal formed by the process of claim 12.

14. A process for generating a photonic crystal, said process comprising the steps of:
    applying cationically-charged photonically-active material to a substrate capable of binding said cationically-charged photonically-active material to form a positively-charged surface on said substrate;
    rinsing non-bound cationically-charged photonically-active material from said positively-charged surface on said substrate;

applying a member selected from the group consisting of anionically-charged micro particles, meso photonic particles and mixtures thereof to said positively-charged surface of said substrate in a pre-determined fashion using a light interference pattern grid to induce ordered-binding of the group member to said positively-charged surface of said substrate so as to form a negatively-charged surface on said substrate;

rinsing the non-bound group member from said negatively-charged surface of said substrate;

applying cationically-charged photonically-active material to said negatively-charged surface of said substrate to form a second positively-charged surface on said substrate;

rinsing non-bound cationically-charged photonically-active material from said second positively-charged surface on said substrate;

repeating for each additional layer desired in said photonic crystal.

15. A photonic crystal formed by the process of claim 14.

16. A system for fabricating photonic crystals, comprising:

a sample cell having a first electrostatic surface charge;

a coherent light source operatively configured to generate a first beam of coherent light;

at least one beam splitter optically coupled to said coherent light source for generating at least a second and a third beam of coherent light form said first beam of coherent light;

at least one reflector in alignment with said beam splitter so as to receive said first, second and third beam of coherent light, said reflector operatively configured to align said first, second and third beams so as to form a relative angle of incidence between each pair of beams of approximately 120 degrees and to form an evanescent light interference pattern grid on said sample cell;

wherein said evanescent interference pattern grid can be used to position particles of a second electrostatic surface charge on said sample cell.

* * * * *